(12) United States Patent
Chen et al.

(10) Patent No.: US 10,405,462 B2
(45) Date of Patent: Sep. 3, 2019

(54) POWER SUPPLY UNIT HAVING A COLD REDUNDANT COLD DETECTION CAPABILITY

(71) Applicant: QUANTA COMPUTER INC., Taoyuan (TW)

(72) Inventors: Chao-Jung Chen, Taoyuan (TW); Yi-Chieh Chen, Taoyuan (TW); Yueh-Chang Wu, Taoyuan (TW); Jhih-Bin Guan, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/048,745

(22) Filed: Jul. 30, 2018

(65) Prior Publication Data

US 2019/0239394 A1 Aug. 1, 2019

Related U.S. Application Data

(60) Provisional application No. 62/623,740, filed on Jan. 30, 2018.

(51) Int. Cl.
*H05K 7/20* (2006.01)
*H05K 7/14* (2006.01)

(52) U.S. Cl.
CPC ....... *H05K 7/20736* (2013.01); *H05K 7/1492* (2013.01); *H05K 7/20909* (2013.01); *H05K 7/20945* (2013.01)

(58) Field of Classification Search
CPC .......... G06F 1/20; G06F 1/263; G06F 1/3296; G06F 2200/201; G06F 1/266; G06F 11/3062; G06F 1/26; G06F 1/3203; H05K 7/20209; H05K 7/20172; H05K 7/1457; H05K 7/1498; H05K 7/20736; H05K 7/1492; H05K 7/20909; H05K 7/20945
USPC .............. 361/709, 679.48, 679.46; 236/49.3; 454/256, 75
See application file for complete search history.

(56) References Cited

U.S. PATENT DOCUMENTS 9,207,732 B1 * 12/2015 Chen ...................... G06F 1/206

* cited by examiner

*Primary Examiner* — Mandeep S Buttar
(74) *Attorney, Agent, or Firm* — Nixon Peabody LLP; Zhou Lu

(57) ABSTRACT

A system and method to ensure the proper operation of a power supply unit in an electronic device. The electronic device has a chassis with a length and a width that includes one area having electronic components. A system fan is located in the chassis relative to the electronic components to generate air flow in the direction of the length of the chassis through the electronic components. A power supply unit is located in parallel to the system fan relative to the width of the chassis. The power supply unit includes an AC input, a DC output and an internal fan. A controller is operable to control the system fan to reduce the air flow when the power supply unit turns on AC power to the AC input, or wakes up from a cold redundant state and outputs DC power from the DC output.

10 Claims, 5 Drawing Sheets

POWER SUPPLY UNIT HAVING A COLD REDUNDANT COLD DETECTION CAPABILITY

CROSS-REFERENCE TO RELATED APPLICATIONS

This application claims priority to and the benefit of U.S. Provisional Application No. 62/623,740, entitled "DETECTION METHOD OF PSU COLD REDUNDANT" and filed on Jan. 30, 2018, the contents of which are hereby incorporated by reference in their entirety as if fully set forth herein.

TECHNICAL FIELD

The present disclosure relates generally to power supply units. More particularly, aspects of this disclosure relate to a system that allows the internal fan of a power supply unit to operate in a cold start condition to insure the power supply unit can always operate.

BACKGROUND

Electronic devices, such as servers, include numerous electronic components that are powered by a common power supply. Servers generate an enormous amount of heat due to the operation of internal electronic components such as controllers, processors, and memory. Overheating from the inefficient removal of such heat has the potential to shut down or impede the operation of such devices. Thus, servers are designed to rely on air flow through the interior of the device to carry away heat generated from electronic components. Servers often include various heat sinks that are attached to the electronic components, such as processing units. Heat sinks are typically composed of thermally conductive material. Heat sinks absorb the heat from the electronic components, thus transferring the heat away from the components. The heat from heat sinks must be vented away from the server. Air flow to vent away such heat is often generated by a fan system. The generated air flow thus carries collected heat away from the components and the heat sink. Thus, air flow can pass through hot electric components in the device without any reverse air flow because the internal layout effectively channels the air flow.

A typical fan system will include multiple fans. Since fan noise increases exponentially with fan rotation speed, reducing rotations per minute (RPM) by a small amount potentially results in a large reduction in fan noise. One technique of modulating fan power is using a pulse width modulation control signal. Pulse width modulation turns the power supply to fan on and off at a fixed frequency. Duty-cycle adjustments may be made to control the speed of the fan. The larger the duty cycle, the faster the fan spins. A proper frequency must be selected since the fan's speed will noticeably oscillate within a PWM cycle if the signal frequency is too slow.

A large, but necessary component for a server is a power supply unit that converts AC power to DC power to power the electronic components. Failure of a power supply unit will result in the failure of the server. Thus, many server designs include multiple power supply units to provide a backup in case of failure of the primary power supply unit. A power supply unit generates heat from the process of converting input power, often in the form of AC voltage, via a transformer and rectifier, to direct current (DC) voltage output. A power supply unit may output the DC voltage, when connected to other components, or when controlled to output DC voltage. The conversion from AC to DC voltage generates heat. Generally, power supply units include an internal cooling fan to ensure the power supply unit does not overheat. Because such an active cooling fan is embedded in a power supply and therefore influences air flow, the location of the power supply unit inside a server is critical for air flow design. For most device designs, the power supply units and system fan wall will be placed in line between the back of the device and the front of the device. This type of in series placement avoids air circulation issues when one power supply unit fails.

FIG. 1A is a diagram of a prior art server 10 that includes various components 12. A fan wall 14 is located in series with two power supply units 16 and 18. The components 12 are cooled by the fan wall 14. As shown in FIG. 1A, this configuration places the power supply units 16 and 18 between the fan wall 14 and the components 12. The fan wall 14 in this example includes separate fans.

FIG. 1B is a diagram of another prior art server 30 that includes various components 32. Similar to the server 10, a fan wall 34 is located in series with two power supply units 36 and 38. The components 32 are cooled by the fan wall 34. As shown in FIG. 1B, this configuration places the fan wall 34 between the power supply units 36 and 38, and the components 32. In both of the servers 10 and 30 in FIGS. 1A and 1B, the in-line placement of the fan wall with the power supply unit generates air flow through the respective components and power supplies as shown in arrows 40. The placement of the power supplies in series with the fan wall means that no reverse air flow occurs through either power supply unit when one of the power supply units fails. While in-line placement of the fan wall with the power supply unit prevents reverse air flow, the arrangement of the components in the server layout is constrained by the in line placement.

In order to maximize air flow for some component placement considerations, certain server designs have the power supply unit and the system fans placed in parallel. FIG. 2 shows such a prior art server 60 that includes various electronic components 62. In this example, the server 60 includes two system fans 70 and 72 that are located in parallel with two power supply units 80 and 82. The fans 70 and 72 generate air flow through the device 60 as shown in by arrows 84. Changes in the air flow circulation generated by the fans 70 and 72 occur when one of the power supply units 80 or 82 fails.

In such designs, failure of a power supply unit such as the power supply unit 82, will cause reverse air flow, as shown by an arrow 86. The lack of air flow around the power supply unit 82 creates a low pressure area because the fans 70 and 72 continue to create air flow. The reverse air flow is generated mainly from a high pressure area backward to a low pressure area around the non-functioning power supply unit 82. The low pressure area creates reverse air flow as shown by the arrows 86.

When this kind of reverse air flow occurs, the internal fan in a power supply unit may fail to start normal rotation when the power supply unit is activated. For example, the fan of a power supply unit may fail due to reverse air flow when the power supply either wakes up from being in a cold redundant state or is newly installed. The reversed speed of the fan in the power supply unit depends on the duty cycle of the PWM signal to the system fans 70 and 72. When system fan duty cycle of the system fans 70 and 72 is high, such as during normal operation, air flow 84 is generated. However, reverse air flow 86 is also generated, and thus it is difficult for the internal fan in the power supply unit to start rotation normally. Typically, a reduction in system fan duty cycle for a short period of time allows the power supply unit fan to start. Such a reduction in fan duty cycle is controlled by software for a controller, such as a chassis management controller.

There are two situations when the internal fan on the power supply unit starts up. One situation is when the AC power is turned on to the power supply unit, and the other situation is when the DC power output is activated. In one example, the AC power being turned on may be detected by a PSU present pin. The DC power is activated when the power supply unit wakes up from cold redundant mode, such as when a power supply unit is brought on line when the primary power supply unit fails. In such instances, the activated power supply unit may not function correctly because the internal fan will not be rotating properly due to the reverse air flow.

Thus, there is a need for a system that ensures the proper start of a cold redundant power supply unit. There is another need for a system that uses both hardware and software to control system fan power to allow for the start of a cold redundant power supply unit. There is another need for a method and system that allows for an internal fan of a power supply unit to properly function when power is output by the power supply unit.

SUMMARY

One disclosed example is a method of ensuring proper operation of a power supply unit in an electronic device. The electronic device also includes a system fan. The power supply unit includes an internal fan and an AC input. The system fan is located in parallel with the power supply unit. It is determined whether AC power is input to the AC input. The fan power of the system fan is reduced to generate air flow at a level sufficient to allow for the operation of the internal fan. The fan power of the system fan is restored to a normal level to generate air flow sufficient to cool the electronic device.

Another example is a method of ensuring proper operation of a power supply unit in an electronic device. The electronic device includes a system fan. The power supply unit includes an internal fan and a DC output. The system fan is located in parallel with the power supply unit. It is determined whether the power supply unit is in a cold redundant mode. Then, it is determined whether DC power is output from the DC output. The fan power of the system fan is reduced to generate air flow at a level sufficient to allow for operation of the internal fan. The fan power of the system fan is reduced to a normal level to generate air flow sufficient to cool the electronic device.

Another example is an electronic device that includes a chassis having a length and a width. The chassis includes one area having electronic components. A system fan is located in the chassis relative to the electronic components to generate air flow in a direction of the length of the chassis through the electronic components. A power supply unit is located in parallel to the system fan relative to the width of the chassis. The power supply unit includes an AC input, a DC output, and an internal fan. A controller is coupled to the system fan and the power supply unit. The controller controls the system fan to reduce the air flow when the power supply unit turns on AC power to the AC input or when the power supply unit wakes up from a cold redundant state and outputs DC power from the DC output.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
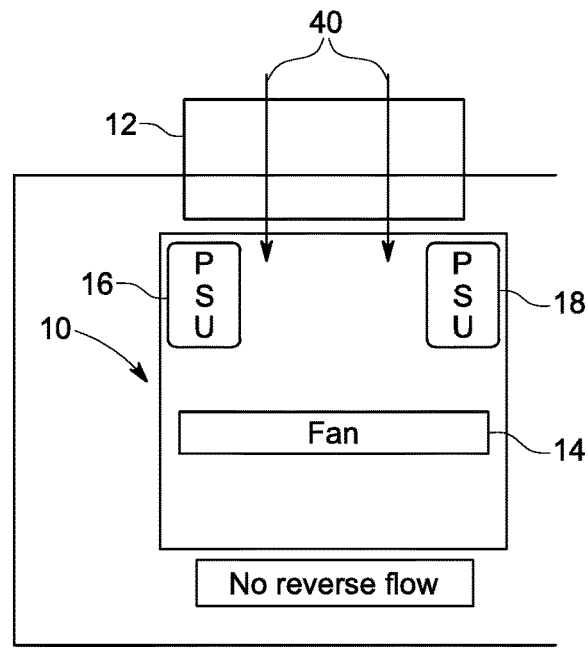
FIG. 1A is a diagram of a prior art server showing one layout of fans in series with a power supply unit.
Figure 1B:
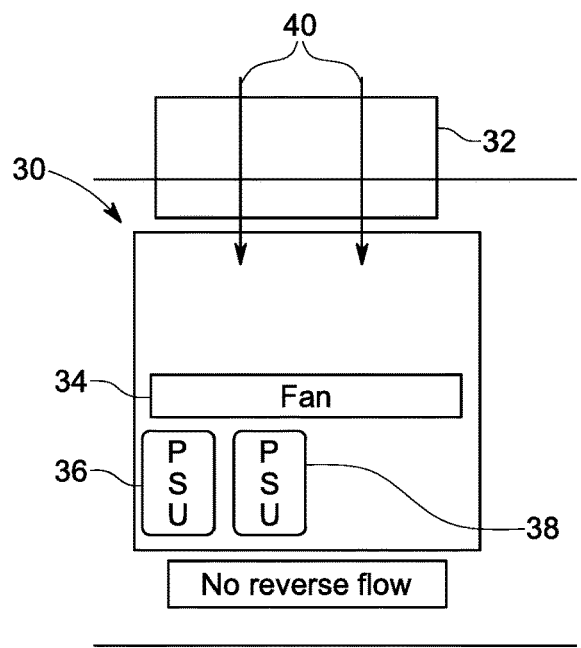
FIG. 1B is a diagram of a prior art server showing another layout of fans in series with a power supply unit.
Figure 2:
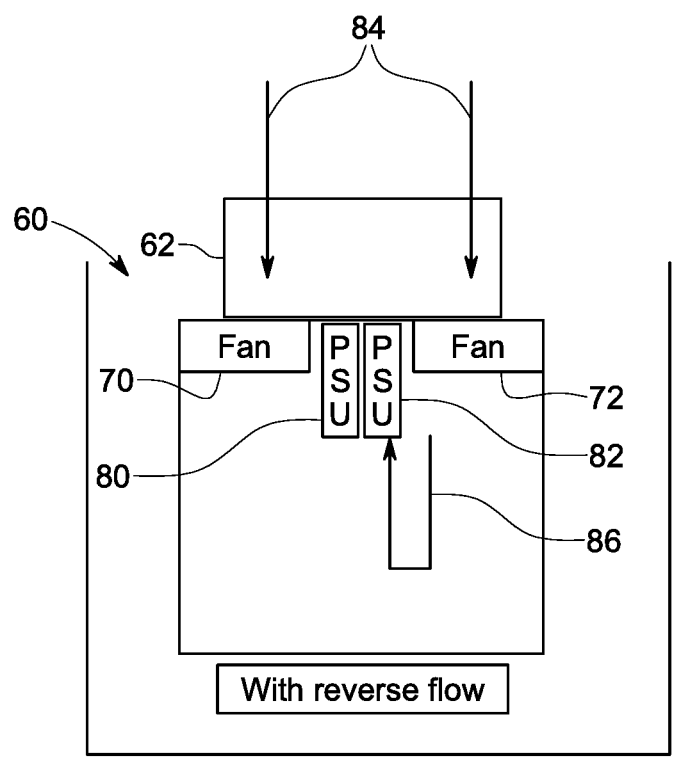
FIG. 2 is a diagram of a prior art server showing a layout of fans located in parallel with power supply units, creating the potential of reverse air flow.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 3:
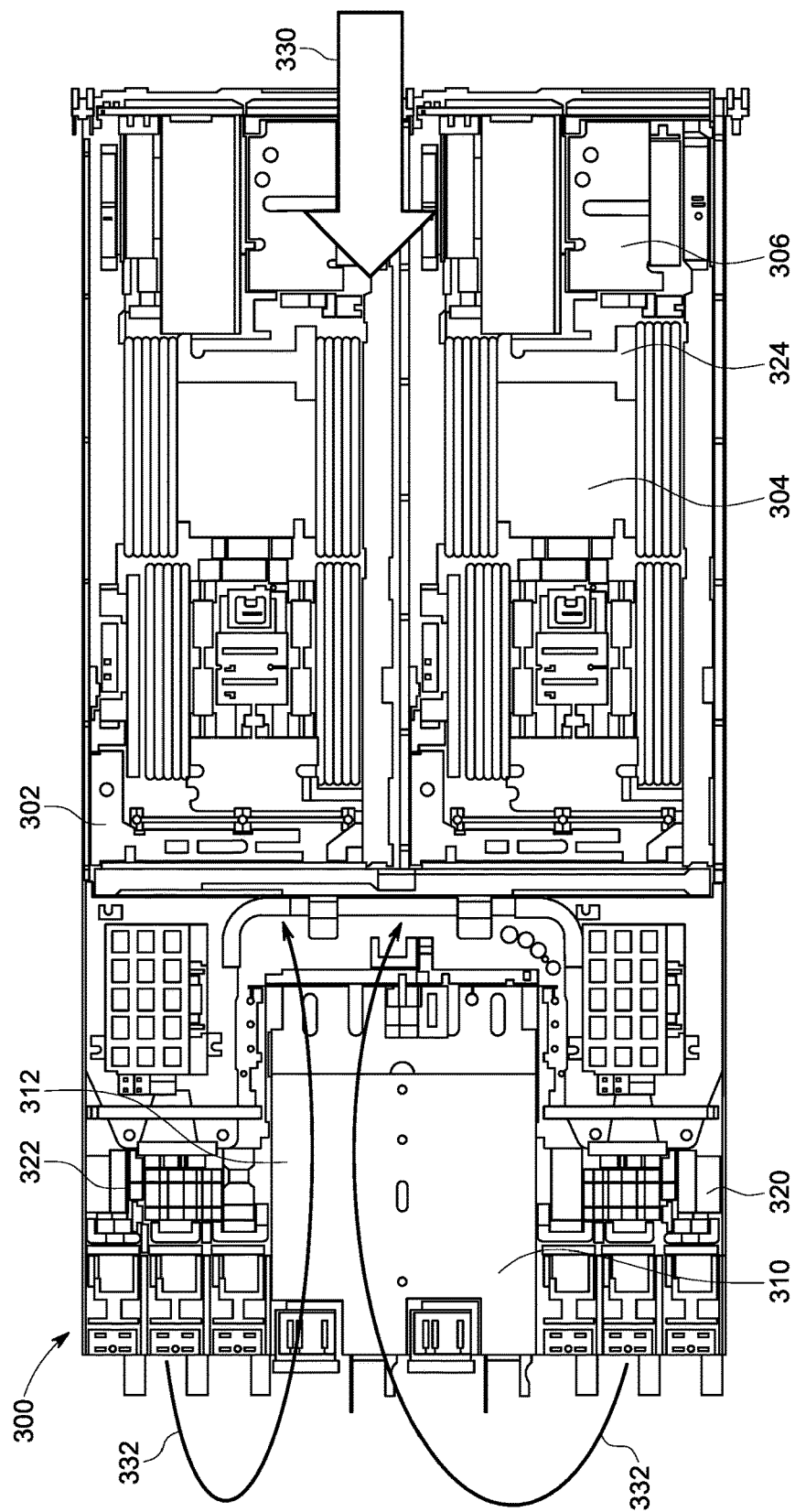
FIG. 3 is a close up view of a server having a layout with power supply units in parallel with fan units that operates to prevent reverse air flow when starting a power supply unit.

FIG. 3 shows a server 300 with a parallel fan and power supply unit configuration. The server 300 includes a chassis 302 that holds electronic components 304 on a motherboard 306. The chassis 302 has an internal area that is defined by the length of the chassis 302 and the width of the chassis 302. The chassis 302 mounts two power supply units 310 and 312. The power supply units 310 and 312 each have at least one internal cooling fan. The power supply units 310 and 312 both have an AC input and at least one DC output in the form of a connector. The electronic components 304 may be connected to connectors on the motherboard 306 that are in turn coupled to the power supply units 310 and 312 to provide DC power to the electronic components 304 when the power supply units 310 and 312 are powered up.

Two fans 320 and 322 are mounted in parallel with the power supply units 310 and 312 along the width of the chassis 302 to create a cooling air flow through the chassis 302. As explained above, the parallel configuration of the power supply units 310 and 312, and the fans 320 and 322, may lead to reverse air flow through the power supply units 310 and 312. The fans 320 and 322 are controlled by a chassis management controller 324. The chassis management controller 324 sends control signals, such as pulse width modulation (PWM) signals, to the fans 320 and 322. The chassis management controller 324 may control the air flow output from the fans 320 and 322 by varying the duty cycle of the PWM control signals.

In order to prevent the failure of the internal fan in the power supply units 310 and 312, the server 300 uses a detection method to ensure that the internal fan starts from the time DC power is turned on in a power supply unit. The time the DC power is turned on is termed waking up from a cold redundant state for a power supply unit. Thus, the chassis management controller 324 sends control signals to reduce the output of the fans 320 and 322 to ensure that the internal fan operates when a power supply wakes up from a cold redundant state.

A hardware anti-reverse fan mechanism is also built into the power supply units 310 and 312. The vendor designs a brake mechanism that takes into account blade resistance. However, when this feature is not implemented to protect the internal fan, the software protection routine detailed below can be integrated. Thus, older systems can be updated to provide such a mechanism without the need to update hardware components.

Figure 4:
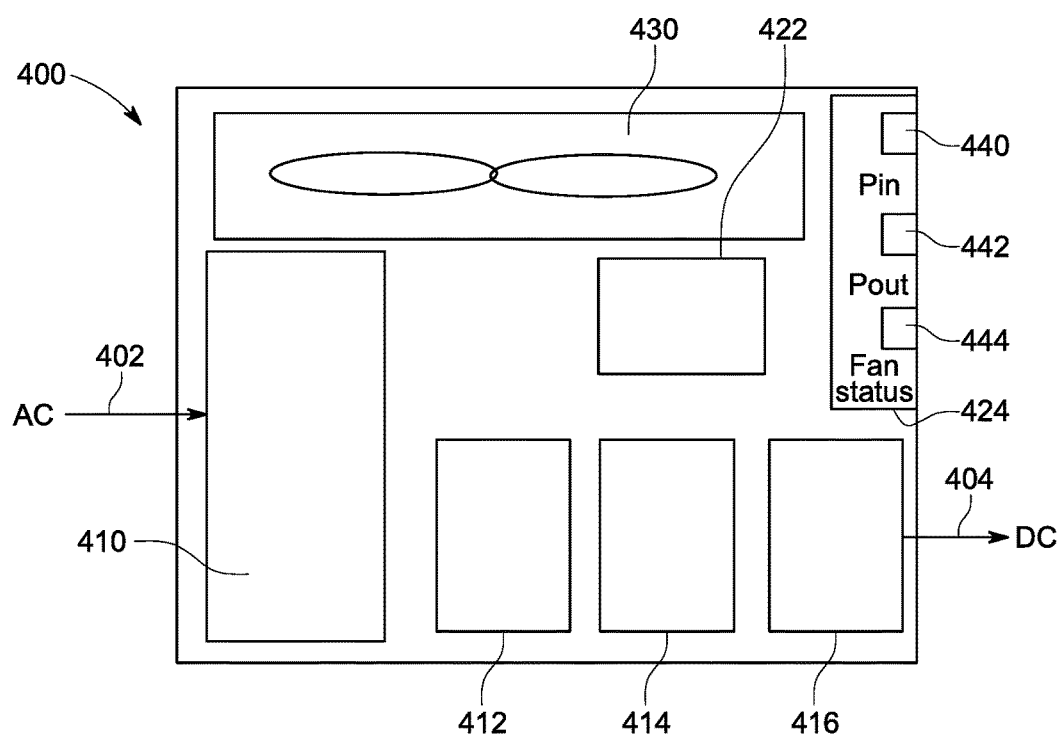
FIG. 4 is a block diagram of a power supply unit.

FIG. 4 is a block diagram of the internal components of a power supply unit 400 that is similar to the power supply units 310 and 312 in FIG. 3. The power supply unit 400 includes an AC power input 402 and at least one DC power output 404. The power supply unit 400 includes a transformer 410 that transforms the AC power signal from the AC power input 402, into a DC power signal that is output from the DC power output 404. The transformer 410 is connected to the AC power input 402. The transformer 410 includes a core that steps down the AC power signal. The stepped down AC power is output to a rectifier 412. The rectifier 412 converts the AC voltage signal to a DC voltage signal that is coupled to a filter 414. The output of the filter 414 is coupled to a voltage regulator 416, which provides the desired level of DC voltage to the DC power output 404. The filter 414 and the regulator 416 are controlled by a controller 422. The controller 422 is coupled to a signal interface 424 that may receive control signals from control components such as a chassis management controller. An internal fan 430 provides air flow to dissipate heat generated by the components of the power supply unit 400. The states of the power supply unit 400 and the internal fan 430 are controlled by the controller 422.

The interface 424 includes different outputs that indicate whether AC or DC power is active. One output, a PSU_Pin output 440 indicates the level of the AC power. A second output, PSU_Pout 442, indicates the level of the DC power being output by the power supply unit 400. When the value of the PSU_Pin output 440 is less than 25 W and the PSU_Pout output 442 is 0 W, the power supply unit 400 enters a cold redundant or fan fail mode, in this example. The internal fan 430 is connected to a status_fan output 444 that provides the current fan speed. In the cold redundant mode or the fan fail mode, the internal fan 430 on the power supply unit 400 may still operate at low speed. In this example, 25 W is the power level determined from testing necessary for keeping the internal fan 430 operating at the low speed. Once this value is known, it may be used to detect the PSU waking up from a cold redundant state as its power will exceed the value. The status_fan output 444 may be detected by hardware such as the chassis management controller 324 in FIG. 3. Thus, the chassis management controller 324 may determine when a power supply unit enters a cold redundant state.

In this example system, wake up timing of the power supply unit 400 from a cold redundant state may be determined. When the power supply unit 400 wakes up from the cold redundant state, it starts outputting DC power. Hence, the PSU_Pin output 440 will be higher than 25 W and PSU_Pout output 442 will be over 0 W. These outputs 440 and 442 may be read by external hardware, such as the chassis management controller 324. When wake up timing data is obtained, software for controlling the duty cycle of the system fans, such as the fans 320 and 322 in FIG. 3, to protect the internal fan 430 may be executed. Thus, the reversed rotation of the fan 430 from reverse air flow is minor and therefore the startup of the fan 430 will be normal.

Figure 5:
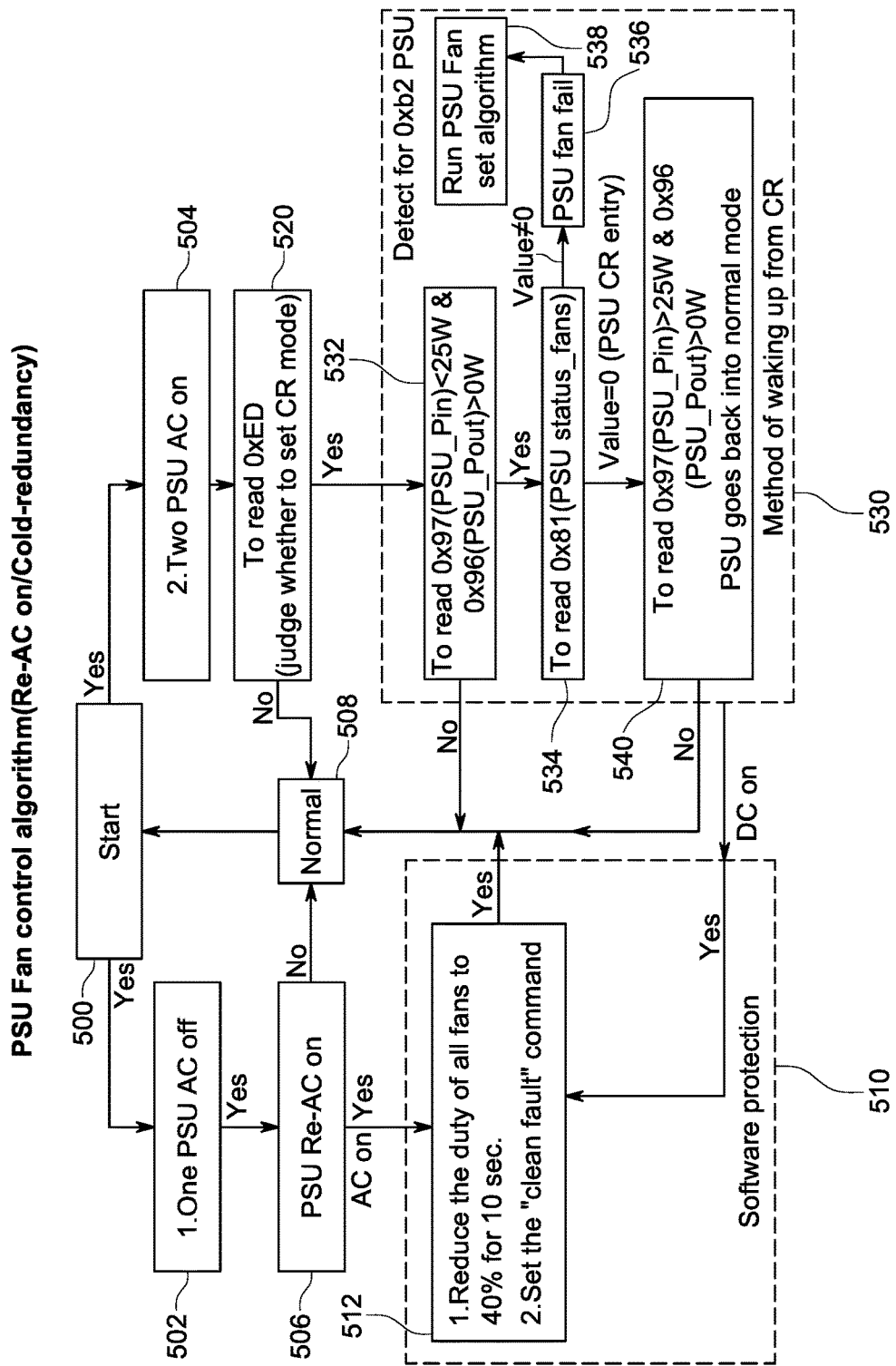
FIG. 5 is a flow diagram of the process of ensuring proper operation of the internal fan of a power supply unit during a cold restart.

FIG. 5 is a flow diagram of the fan control algorithm running in the server 300 in FIG. 3. At the start (500), the system determines the power status of the power supply units 310 and 312 in FIG. 3. In a first case, only a single power supply unit is powered on and therefore the other power supply unit is in a cold state without receiving the AC input voltage (502). In a second case, both power supply units are powered on (504).

When one of the power supply units does not receive the AC input voltage signal indicating AC power, the system detects whether the AC power is activated (506). This may be accomplished by sensing the level of the AC output by reading the PSU_Pin output 440 in FIG. 4. If the AC power is not activated, the system proceeds with normal operation of the fans 320 and 322 in FIG. 3 (508). If the AC power is activated on a power supply unit that is off, the system proceeds with running a software protection routine 510. The software protection routine 510 runs a sequence (512) that includes reducing the duty cycle of the fans 320 and 322, setting a clean fault command. In this example, the routine 510 reduces the duty cycle of both fans 320 and 322 to 40% for 10 seconds. The routine 510 then sets a clean fault command, which prevents the server from sending a "fault" signal. This allows the method to proceed with reducing the duty cycle of the fans 320 and 322 without receiving regular alerts that the fans are not functioning properly. After the routine 510 is executed, the internal fan on the power supply unit that has AC power activated has sufficient time to power up and function normally. The system loops back to the normal operation and restores the fans 320 and 322 to the normal duty cycle (508).

The system also allows protection of the internal fan when a power supply unit wakes up from the cold redundant mode and starts to output DC power. In the case that both power supply units 310 and 312 are connected to AC power (504), the routine determines whether to set a cold redundant mode for the power supply units by reading the cold redundant status address of the power supply unit (520). If the cold redundant mode is started as indicated by the cold redundant status address, the routine will enter a subroutine 530 for waking up from the cold redundant mode.

The wake up routine 530 first reads the PSU-Pin output of the power supply and determines whether the AC power is less than a threshold power value such as 25 W (532). The wake up routine also reads the PSU_Pout output to determine if there is no power (e.g., 0 W) from the DC output (532). If either the AC power is greater than the threshold value or DC power is being output, the routine 530 loops back to normal operation of the fans (508). If both the AC power is less than the threshold value and there is no DC power, the routine 530 will read the status_fan output to determine the speed of the internal fan of the power supply unit (534). If this value is not 0, indicating a failure, the routine will determine a failure of the fan (536). The routine will then run a power system unit fan failure algorithm (538).

If the value of the PSU status fan output 444 in FIG. 4 is zero, this indicates that the power supply unit is in cold redundant mode. The routine then determines whether the PSU_Pin output is greater than the threshold power value (25 W), and reads the PSU_Pout output to determine if there is any DC power output (540). If both conditions are true, the routine loops to the software protection routine 510 to reduce system fan duty cycles to allow the internal fan to begin normal rotation. If either condition is not true, the system fans continue to operate in normal mode as the power supply unit is not waking from the cold redundant state (508).

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method of ensuring proper operation of a power supply unit in an electronic device including a system fan, the power supply unit including an internal fan and an AC input, wherein the system fan is located in parallel with the power supply unit, the method comprising: detecting that an AC power is input to the AC input; reducing fan power of the system fan to generate air flow at a level sufficient to allow operation of the internal fan; and restoring the fan power of the system fan to a normal level to generate air flow sufficient to cool the electronic device.

2. The method of claim 1, further comprising: detecting that the power supply unit is in a cold redundant mode, wherein the power supply unit further includes a DC output; detecting that a DC power is output from the DC output; and performing the reduction of the fan power of the system fan, and the restoration of the fan power if DC power is output from the DC output.

3. The method of claim 2, wherein detecting that DC power is output from the DC output is performed by monitoring the status of the internal fan.

4. The method of claim 1, wherein the system fan is coupled to a pulse width modulation input signal, and wherein the fan power is reduced by reducing a duty cycle of the pulse width modulation input signal.

5. The method of claim 1, wherein the reduction of the fan power occurs for a predetermined period of time.

6. A method of ensuring proper operation of a power supply unit in an electronic device including a system fan, the power supply unit including an internal fan, and a DC output, wherein the system fan is located in parallel with the power supply unit, the method comprising: detecting that the power supply unit is in a cold redundant mode; detecting that a DC power is output from the DC output; reducing the fan power of the system fan to generate air flow at a level sufficient to allow operation of the internal fan; and restoring the fan power of the system fan to a normal level to generate air flow sufficient to cool the electronic device.

7. The method of claim 6, wherein the power supply unit includes an AC input, the method further comprising: detecting that AC power is input to the AC input; and performing the reduction of the fan power of the system fan and the restoration of the fan power if AC power is output from the AC input.

8. The method of claim 6, wherein detecting that the DC power is output from the DC output is performed by monitoring the status of the internal fan.

9. The method of claim 6, wherein the system fan is coupled to a pulse width modulation input signal, and wherein the fan power is reduced by reducing a duty cycle of the pulse width modulation input signal.

10. The method of claim 6, wherein the reduction of the fan power occurs for a predetermined period of time.

* * * * *